(12) United States Patent
Matsuoka et al.

(10) Patent No.: US 7,616,845 B2
(45) Date of Patent: Nov. 10, 2009

(54) OPTICAL MODULE

(75) Inventors: Yasunobu Matsuoka, Hachioji (JP);
Makoto Takahashi, Kokubunji (JP);
Kazuhiko Hosomi, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/120,467

(22) Filed: May 14, 2008

(65) Prior Publication Data
US 2008/0285914 A1 Nov. 20, 2008

(30) Foreign Application Priority Data
May 17, 2007 (JP) ............................... 2007-131205

(51) Int. Cl.
*G02B 6/12* (2006.01)
*G02B 6/32* (2006.01)

(52) U.S. Cl. .......................................... 385/14; 385/33

(58) Field of Classification Search .................... 385/14, 385/33
See application file for complete search history.

(56) References Cited

U.S. PATENT DOCUMENTS

| 6,445,857 | B1 * | 9/2002 | Korenaga et al. ............. 385/52 |
| 6,572,278 | B2 * | 6/2003 | Hsieh et al. .................... 385/88 |
| 6,684,010 | B1 * | 1/2004 | Morris et al. .................. 385/39 |
| 7,203,391 | B2 * | 4/2007 | Uekawa et al. ................ 385/14 |
| 7,290,942 | B2 * | 11/2007 | Kuhara et al. ................. 385/88 |
| 7,447,400 | B2 * | 11/2008 | Yokino et al. ................. 385/18 |
| 2004/0234205 | A1 * | 11/2004 | Shimada et al. ............... 385/50 |
| 2004/0234417 | A1 * | 11/2004 | Schienle et al. .......... 422/82.08 |
| 2004/0252867 | A1 * | 12/2004 | Lan et al. ..................... 382/124 |
| 2005/0094282 | A1 * | 5/2005 | Minakawa et al. .......... 359/634 |
| 2006/0138434 | A1 * | 6/2006 | Summers ..................... 257/84 |
| 2007/0092193 | A1 * | 4/2007 | Yokino et al. ............... 385/129 |
| 2007/0286549 | A1 * | 12/2007 | Warashina et al. ............ 385/33 |
| 2008/0285914 | A1 * | 11/2008 | Matsuoka et al. ............. 385/24 |

FOREIGN PATENT DOCUMENTS

JP 2006-154535 6/2006

* cited by examiner

*Primary Examiner*—K. Cyrus Kianni
(74) *Attorney, Agent, or Firm*—Antonelli, Terry, Stout & Kraus, LLP.

(57) ABSTRACT

An optical module includes an optical element mount substrate having a laser diode and a photo detector mounted thereon on a straight line in a horizontal direction of the surface of the substrate, a first optical function integrate substrates, provided in its one surface with surfaces tilted at an angle to the parallel surface of the substrate for refracting light propagated in a substrate thickness direction, the two tilted surfaces being arranged to face each other. The photo detector and the first and second optical function integrate substrates are laminated in the substrate thickness direction, a first optical wavelength filter and a reflecting film having different wavelength transmissivities to the propagation light are provided in an optical path between the first and second tilted surfaces.

7 Claims, 15 Drawing Sheets

OPTICAL MODULE

CLAIM OR PRIORITY

The present application claims priority from Japanese application JP 2007-131205 filed on May 17, 2007, the content of which is hereby incorporated by reference into this application.

BACKGROUND OF THE INVENTION

The present invention relates to optical modules and more particularly to the structure of an optical module as a terminal device of a wavelength division multiplexing optical transmission type or of a single-fiber bidirectional transmission type which transmits light of a plurality of wavelengths over a single optical fiber, and also a method of manufacturing the optical module.

In a recent information communication field, it is on its way to a rapid spread of upgrading communication traffic for high speed optical transfer of a large amount of data. In particular, a wider band of communication in access line has been accelerated with an explosive spread of the internet, and a remarkable increase in the market of FTTH (Fiber To The Home) service is seen. Among FTTH optical transmission systems, a PON (Passive Optical Network) system, in which a plurality of subscribers share a single fiber, is currently being increased in demand. In this system, data transmitted from a vendor's local station via a single fiber is branched by a splitter into 16 to 32 fibers, via which the data is distributed to respective subscribers, thus remarkably reducing the fiber laying cost. An ONU (Optical Network Unit) is installed on the side of each subscriber as a terminal device, and using wavelength-division multiplex (WDM), a down-link signal (having a wavelength of 1.5 µm) from the vendor's local station to the subscriber side and an up-link signal (having a wavelength of 1.3 µm) from the subscriber side to the vendor's local station are multiplexed to transmit the up- and down-link signals over the same fiber. A duplexer optical module is built in the ONU. The duplexer optical module is basically made up of a laser diode for transmission of the up-link signal, a photo detector for reception of the down-link signal, and a WDM filter for separating the up- and down-link signals.

Prior art module systems are roughly classified into two groups as follows. FIG. 12 shows a basic arrangement of a BIDI (BI-DIrectional) module of a system belonging to a first group including optical components of an LD 135, a PD 132, and a WDM filter 137 spatially arranged in a package 138. In this system, since the optical components can be manufactured independently of one another, a good manufacturing yield can be easily secured. This system can advantageously have a stable optical coupling efficiency, because lenses 131 and 134 integrated in CAN packages 133 and 136 are optically aligned with a fiber 130 while optical elements 135 and 132 mounted on the CAN packages 133 and 136 are operated, that is, because the lenses can be optically connected with the fiber 130 in a so-called active alignment. However, since this system requires an increased number of necessary components and an increased number of processing steps, the system becomes disadvantageous when it is desired to make the system compact and to reduce a cost.

FIG. 13 shows a basic arrangement of a PLC (Planar Lightwave Circuit) module of a system belonging to a second group, including respective optical components mounted on a waveguide substrate. In this system, when compared with the aforementioned BIDI module, such optical components as optical elements 141, 143 (for example, 141 being an LD and 143 being a PD) and a filter 142 can be integrated on the same platform substrate 140. Thus the module of the system can be made compact with a less number of necessary components and a less number of processing steps. In this PLC system, however, optical alignment is carried out based on only the alignment accuracies of the respective optical components while the system monitors alignment marks provided on the platform substrate 140 for the respective optical elements, that is, the system is of a so-called passive alignment scheme. Thus a mounting margin for causing the alignment accuracies of the optical components to be simultaneously satisfied becomes small and therefore it is difficult to secure a good manufacturing yield. Further, since light to be transmitted is propagated through an optical waveguide 145 mounted on the platform substrate 140, the characteristics of this system are more influenced by the propagation loss in the optical waveguide or by a change in the environmental temperature than the spacial light transmitting system. In addition, since the system has an optical connection with a low loss, an optical fiber 144 is required to be mounted close to the optical waveguide 145. For this reason, it is difficult to vacuum the optical module package and to secure a high reliability.

An example of a mounting structure of a duplexer optical module different from the above two prior systems is disclosed in JP-A-2006-154535. This optical module is shown in FIGS. 14A and 14B respectively as its perspective view and top view. The optical module of the illustrated example includes a substrate 1100 having a first tilted surface structure 1100a etched in a first direction and a second tilted surface structure 1100b etched in a second direction at an angle of 90 degrees with the first direction; a wavelength demultiplexer 1500 of a cubic shape arranged on the substrate for transmitting light or reflecting light by an angle of 90 degrees according to the wavelength; a laser-diode-side lens element 1400a arranged in the first tilted surface structure; a photo-detector-side lens element 1400b arranged in the second tilted surface structure; a laser diode 1200 arranged in the vicinity of an end of the first tilted surface structure for emitting light, passing the light through the laser-diode-side lens element and the wavelength demultiplexer, and externally outputting it; and a photo detector 1300 arranged in the vicinity of the end of the second tilted surface structure for receiving external light through the wavelength demultiplexer and the photo-detector-side lens element.

With such an arrangement, since optical elements can be collectively mounted on the same substrate as in the aforementioned PLC system, the optical module can be made compact. Because of its excellent productivity, the module can be inexpensively manufactured. In addition, since light transmitted between the fiber and the optical elements is propagated in a space on the substrate through the lens elements 1400a, 1400b and the wavelength demultiplexer, this module can avoid such a problem as mentioned above that characteristics are influenced by a propagation loss of the optical waveguide medium or by a change in the environmental temperature.

SUMMARY OF THE INVENTION

In the optical module disclosed in JP-A-2006-154535, the lens elements 1400a, 1400b and the wavelength demultiplexer 1500 are provided as optical components and each is required to be mounted individually on the platform substrate 1100 in passive alignment. Thus the total number of steps of mounting optical components including the step of mounting the above optical elements can be somewhat increased. A margin for the positional accuracy of the wavelength demultiplexer 1500 and especially for the angle deviation thereof is small, requiring accurate mounting and making it difficult to secure a good yield. When consideration is paid to the expansibility of, e.g., a triplexer optical module, in addition, the number of necessary optical components and a mounting surface area are required to be about twice of those in the above two prior art systems. This requires the module to be made more compact more accurate mounting, with the result that it becomes correspondingly more difficult to secure a good yield.

It is therefore an object of the present invention to provide an optical module as a terminal device of a wavelength division multiplexing optical transmission or single-fiber bidirectional transmission type, which can transmit light having a plurality of wavelengths over a single optical fiber, can remarkably reduce the number of necessary optical components and the number of mounting steps through a batch processing such as a wafer process while securing good optical characteristics with a low loss and high reliability, and also can be made compact and have a high yield.

In accordance with an aspect of the present invention, the above problem is solved by providing an optical module which is arranged as follows. That is, the optical module includes an optical element mount substrate having a laser diode and a photo detector mounted thereon on a straight line in a horizontal direction of the parallel surfaces of the substrate; a first optical function integrate substrate made of such a material as transparent to the wavelength of propagation light, the first substrate being provided in its one surface with a first surface which is tilted at an angle with respect to the parallel surfaces of the substrate for refracting light propagated in a substrate thickness direction; and a second optical function integrate substrate made of a material transparent to the wavelength of propagation light different from that of the first substrate, the second substrate being provided in its one surface with a second surface which is tilted at an angle with respect to the parallel surfaces of the substrate for refracting light propagated in a substrate thickness direction. At least a first optical wavelength filter and a reflecting film having different wavelength transmissivities for propagation light are provided in an optical path between the first and second tilted surfaces.

In the aspect of the present invention, at this time, light emitted from the laser diode on the optical element mount substrate is transmitted through the first optical function integrate substrate and the first and second optical wavelength filters, and optically connected with an optical fiber provided outside of the substrate. Light having a wavelength output from the optical fiber and different from the output light of the laser diode is transmitted through the second optical function integrate substrate, reflected by the first optical wavelength filter and the reflecting film, transmitted through the second optical function integrate substrate, and then directed onto the photo detector provided on the optical element mount substrate. To this end, the first and second optical function integrate substrates are stacked on the optical element mount substrate as a base, and fixed thereto as shown, e.g., in FIG. 1.

The optical module is arranged so that the first tilted surface provided on the first optical function integrate substrate is parallel to the second tilted surface provided on the second optical function integrate substrate.

Further, the first tilted surface provided on the first optical function integrate substrate and the second tilted surface provided on the second optical function integrate substrate are formed on a wafer by etching, the optical element mount substrate and the first and second optical function integrate substrates are collectively bonded in the substrate thickness direction at wafer level, and then the bonded wafer is cut into individual optical module chips by a manufacturing method.

In accordance with aspects of the present invention, there can be provided an optical module as a terminal device of a wavelength division multiplexing optical transmission or single-fiber bidirectional transmission type which can transmit light of a plurality of wavelengths over a single optical fiber, which can remarkably reduce the number of necessary optical components and the step of mounting steps through a batch processing such as a wafer process while securing good optical characteristics with a low loss and high reliability, and also can be made compact with a high yield, and also can be provided a method of manufacturing the optical module.

Other objects, features and advantages of the invention will become apparent from the following description of the embodiments of the invention taken in conjunction with the accompanying drawings.

DETAILED DESCRIPTION OF THE EMBODIMENTS

Embodiments of the present invention will be detailed.

Embodiment 1

Figure 1:
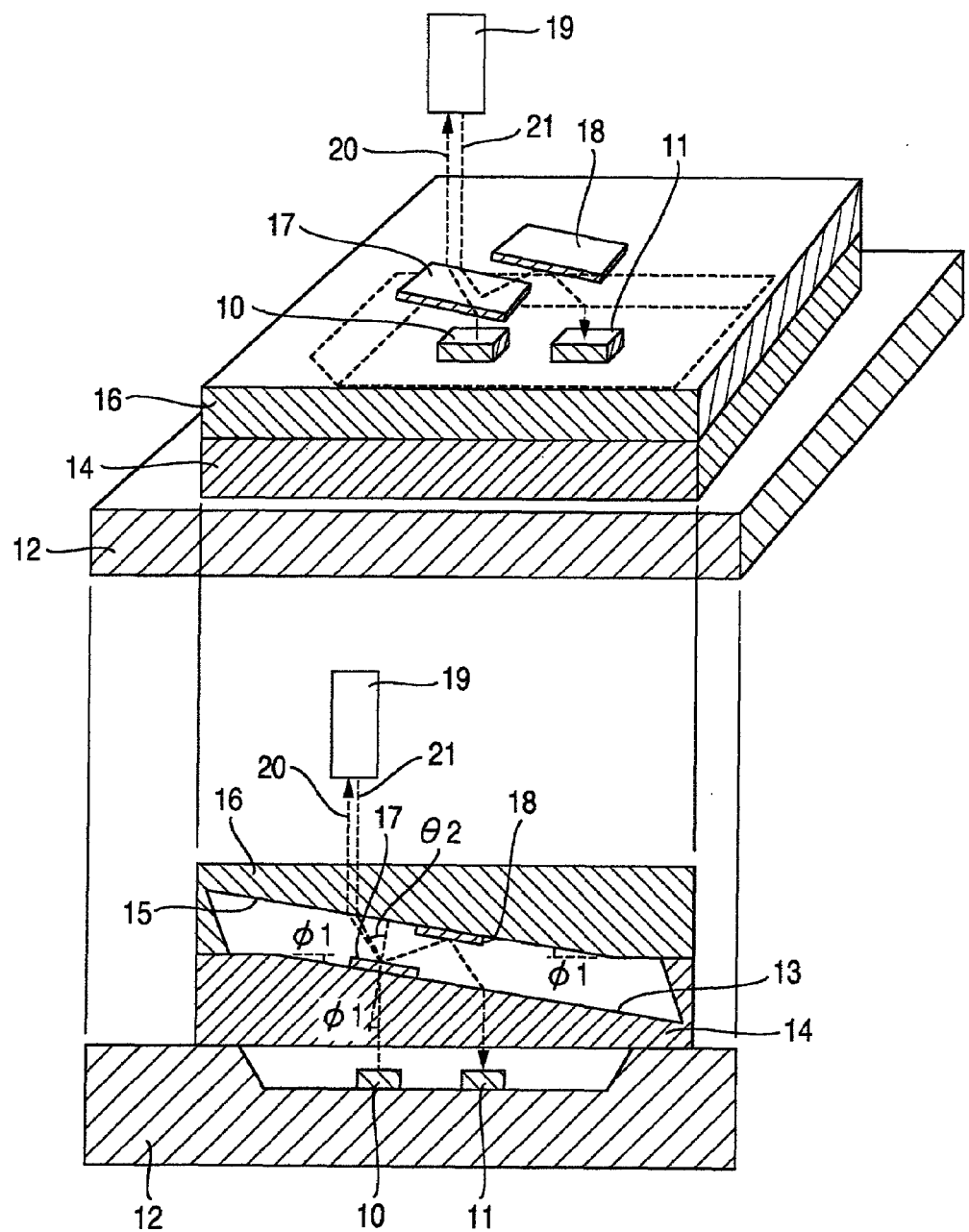
FIG. 1 shows perspective and cross-sectional views of an optical module in accordance with a first embodiment of the present invention.

FIG. 1 shows perspective and cross-sectional views of an optical module in accordance with a first embodiment of the present invention.

The arrangement of FIG. 1 includes an optical element mount substrate 12 having a laser diode 10 and a photo detector 11 mounted thereon on a straight line in a horizontal direction of the parallel surfaces of the substrate; a first optical function integrate substrate 14 provided in its one surface with a first tilted surface 13, the first surface being tilted at an angle with respect to the horizontal surfaces of the substrate for refracting light propagated in a substrate thickness direction; and a second optical function integrate substrate 16 provided in its one surface with a second tilted surface 15, the second surface tilted at an angle with respect to the horizontal surfaces of the substrate for refracting light propagated in a substrate thickness direction. In this arrangement, the photo detector 11 and the first and second optical function integrate substrates 14 and 16 are stacked in the substrate thickness direction, a first optical wavelength filter 17 and a reflecting film 18 having different wavelength transmissivities are mounted in an optical path between the first and second tilted surfaces 13 and 15. with such an arrangement, light 20 emitted from the laser diode 10 mounted on the optical element mount substrate 12 is transmitted through the first optical function integrate substrate 14, the first optical wavelength filter 17 and the second optical function integrate substrate 16 to be optically connected with an optical fiber 19 provided outside of the substrate. The module can have the function of the single-fiber bidirectional transmission type module that light 21 output from the optical fiber 19 and having a wavelength different from the output light of the laser diode 10 is transmitted through the second optical function integrate substrate 16, reflected by the first optical wavelength filter 17 and the reflecting film 18, transmitted through the first optical function integrate substrate 14, and directed onto the photo detector 11 mounted on the optical element mount substrate 12.

When the substrates having the optical function are three-dimensionally arranged in the substrate thickness direction in this way, the optical module of a chip scale can be manufactured compact at a high integration density. Since the optical element mount substrate 12 and the first and second optical function integrate substrates 14 and 16 can be manufactured by a wafer process (to be explained later), the number of necessary components and the number of manufacturing steps can be reduced remarkably as compared with the prior art system when optical components are mounted on a substrate respectively separately, and therefore a low cost and a high yield can be expected. Further, since light to be transmitted is propagated through the substrates and the space, when compared with the PLC type module using the aforementioned optical waveguide, this module can avoid the problem that characteristics are influenced by the propagation loss of the medium or by a change in the environmental temperature. Further, with the arrangement of the present invention, when consideration is paid to its expansibility, addition of an optical component only requires an optical function integrate substrate to be added and stacked in the substrate thickness direction. As a result, when compared with the prior art system having individual optical components added in two-dimensional directions, expansion can be attained with a decreased number of components and with less mounting surface area.

The material of the optical element mount substrate 12 is not specifically limited to the illustrated example. However, since the material forms electric lines with the optical elements 10 and 11 and with the package are formed on the substrate (which will be explained later), semiconductor such as Si or ceramic is preferable as the material. Further, since light to be transmitted from the laser diode 10 to the optical fiber or from the optical fiber to the photo detector 11 is transmitted through the materials of the first and second optical function integrate substrates 14 and 16, such materials as transparent to the wavelength of propagation light or as to have high transparencies thereto is required. When consideration is paid to such a case that identical substrates are manufactured by a wafer process (to be explained later), it is preferable to use silica glass, Si, InP, GaAs or the like as the material.

An example of operation of this optical module is as follows. For example, the propagation light 20 having a wavelength λ1 is directed from the laser diode 10 to the first optical function integrate substrate 14 at an angle vertical to the substrate. After the propagation light 20 is propagated through the interior of the first optical function integrate substrate 14, the light 20 is bent through the tilted surface 13 and the optical wavelength filter 17 each having an angle φ1 with respect to the parallel surfaces of the substrate to have an angle θ2 with respect to a direction of the normal of the tilted surface 13. The bent light is propagated through the interior of the second optical function integrate substrate 16, and then externally output from the substrate 16. In the illustrated example, a refraction angle θ2 is determined by a tilt angle φ1 (with respect to a direction of an extension of the parallel surfaces of the substrate) of the tilted surface 13, the refractive index of the material of the first optical function integrate substrate 14, and the refractive index of a material (air herein assumed) outside of the substrate. Next, the propagation light 20 is directed to the surface 15 tilted at the absolute value of the angle of φ1 with respect to the parallel surfaces of the second optical function integrate substrate 16, refracted the surface 15, propagated through the interior of the optical function integrate substrate 16, externally output from the substrate, and then directed into the optical fiber 19. At this time, when the tilted angles of the first and second optical function integrate substrates 14 and 16 are the same, that is, when the substrates have the same angle φ1, the light incident to the optical function integrate substrate 14 in a direction vertical to the substrate 14 from the laser diode 10 is output from the second optical function integrate substrate 16 in a direction vertical to the substrate 16 according to the Snell's law.

In this case, the Snell's law is given by an equation, n1×sin φ1=n2×sin θ2. In the equation, n1 denotes the value of a refractive index for the material of an integrate substrate, n2 denotes the value of a refractive index for a gap in a vacuumed atmosphere, or the value of a refractive index for a gas or air of the gap or for the filler material of the gap.

Similarly, the propagation light 21 having, for example, a wavelength λ2 is directed from the fiber 19 into the second optical function integrate substrate 16 in a direction vertical to the substrate. The propagation light 21 is propagated through the interior of the second optical function integrate substrate 16, bent at an angle θ2 by the second φ1-tilted surface 15 of the second optical function integrate substrate 16 tilted at an angle φ1 with respect to the parallel surfaces of the substrate. The propagation light 21 is then reflected by the first optical wavelength filter 17 and the reflecting film 18, directed into the tilted surface 13 of the first optical function integrate substrate 14, propagated through the interior of the first optical function integrate substrate 14, output externally from the substrate 14, and then directed onto the photo detector 11.

Since the laser diode 10 and the photo detector 11 mounted on the optical element mount substrate 12 outputs and receives light propagated in the substrate thickness directions, it is preferable from the viewpoint of mounting simplicity that the laser and the detector be a surface emitting laser diode and a surface illuminated photo diode respectively.

Embodiment 2

Figure 2:
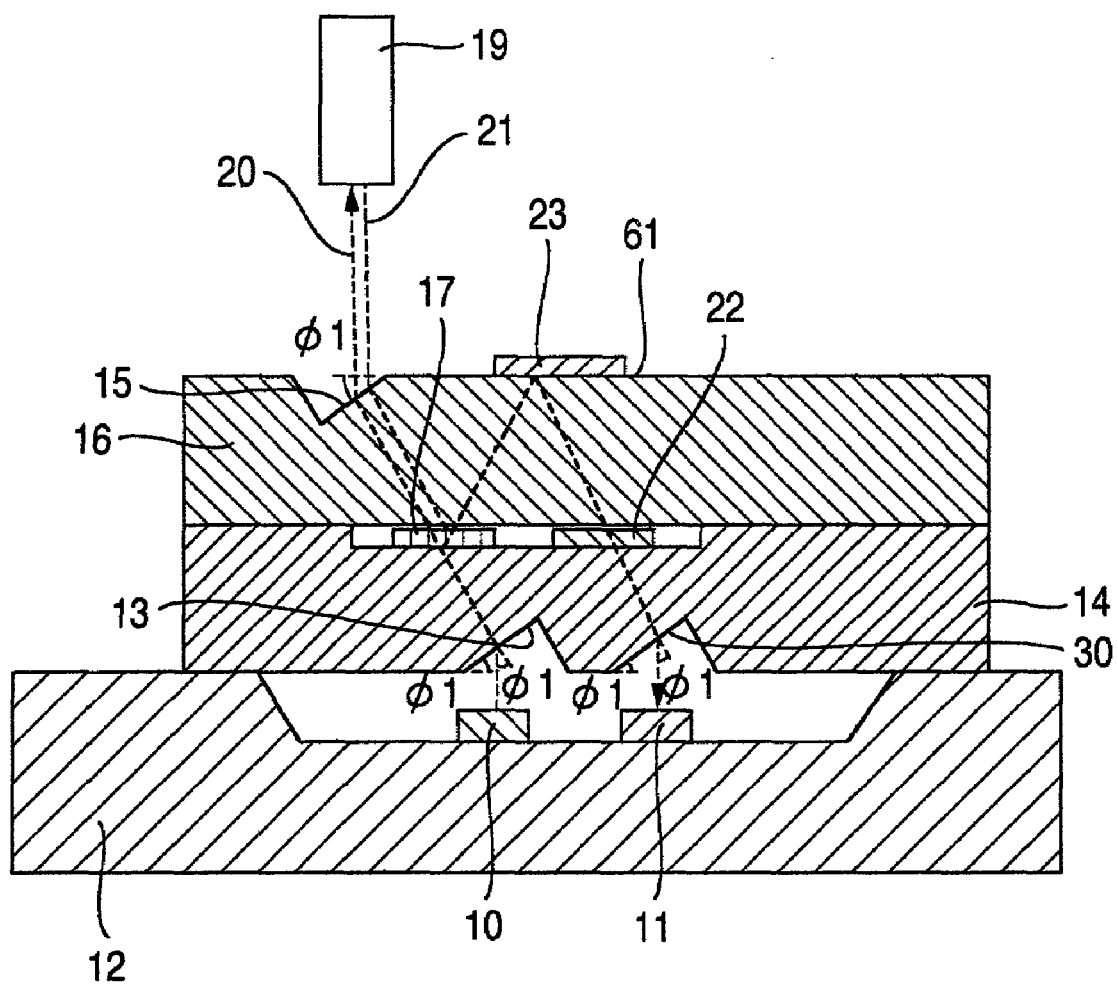
FIG. 2 is a cross-sectional view of an optical module in accordance with a second embodiment of the present invention.

FIG. 2 shows a cross-sectional view of an optical module in accordance with a second embodiment of the present invention. The present embodiment shows an example of the optical module having the same function as the illustrated structure of the optical module of the first embodiment but having a different structure from the first embodiment. As shown in FIG. 2, the illustrate module comprises an optical element mount substrate 12 having a laser diode 10 and a photo detector 11 mounted thereon on a straight line in a direction horizontal to parallel surfaces of the substrate; a first optical function integrate substrate 14 provided in its one surface with a first tilted surface 13 and a third tilted surface 30, the first and third tilted surfaces having a predetermined angle with respect to the parallel surfaces of the substrate for refracting light propagated in a substrate thickness direction; and a second optical function integrate substrate 16 provided in its one surface with a second tilted surface 15, the second tilted surface having an angle with respect to the parallel surfaces of the substrate for refracting light propagated in a substrate thickness direction. In this arrangement, as in the first embodiment, the optical element mount substrate 12 and the first and second tilted surfaces 13 and 15 are laminated in the substrate thickness direction, and a first optical wavelength filter 17 and a reflecting film 23 having different wavelength transmissivities to propagation light are placed in an optical path between the first and second tilted surfaces 13 and 15 and in an optical path between the third and second tilted surfaces 30 and 15 respectively.

With this arrangement, similarly to the operation explained in connection with the embodiment 1, propagation light 20 emitted from the laser diode 10 having, e.g., a wavelength λ1 and directed into first optical function integrate substrate 14 in a direction perpendicular to the substrate is bent at an angle θ2 by the tilted surface 13 having a surface tilted a angle φ1 with respect to the parallel surfaces of the substrate, and then propagated through the interior of the first optical function integrate substrate 14. In this case, the refraction angle θ2 is determined by the tilt angle φ1 (with respect to an extension of the parallel surfaces of the substrate) of the tilted surface 13 and by the refractive index of the optical function integrate substrate 14 and the refractive index of a substance (air assumed herein) outside of the substrate. The propagation light 20 is passed through the first optical wavelength filter 17, and then propagated in the interior of the second optical function integrate substrate 16. The propagation light is further output refractedly externally from the tilted surface 15 of the optical function integrate substrate 16 having the absolute value of the tilted surface angle φ1 with respect to the parallel surfaces of the optical function integrate substrate 16, and directed into the fiber 19. At this time, when the tilted surface angles of the tilted surfaces of the optical function integrate substrates 14 and 16 are the same, that is, when the tilted surface angles are the same as φ1, light emitted from the laser diode 10 and directed into the first optical function integrate substrate 14 in a direction perpendicular to the substrate is output from the optical function integrate substrate 16 in a direction perpendicular to the substrate according to the Snell's law.

Even the aforementioned optical module can have effects similar to those of the structure explained in the embodiment 1. Even in this structure, similarly to the structure of the embodiment 1, the material of the optical element mount substrate 12 is preferably such semiconductor as Si or ceramic. The first and second optical function integrate substrates 14 and 16 are required to be made of materials transparent to the wavelength of the propagation light, and these materials are preferably silica glass, Si, InP, GaAs or the like. It is preferable that the tilted surface angles of the first, second and third tilted surfaces 13, 15 and 30 be the same as φ1, so that the light 20, 21 directed from or to the optical fiber 19 vertically to the parallel surfaces of the optical function integrate substrate is passed through the optical function integrate substrates 14 and 15 and directed to the laser diode 10 and the photo detector 11 mounted on the optical element mount substrate 12 in directions perpendicular to the laser and detector.

With the structure of FIG. 2, further, the propagation light 21 output from the optical fiber 19 is passed through the second tilted surface 15 and the second optical function integrate substrate 16, reflected by the first optical wavelength filter 17, and reflected by an interface 61 between the second optical function integrate substrate 16 and a substance outside of the substrate. In this case, if light propagated through the interior of the second optical function integrate substrate 16 fails at the interface 61 to satisfy the total reflection condition, then the light is externally emitted with an excessive loss. Thus, it becomes necessary to apply a reflecting film 23 to the interface 61. This requires the number of components and the number of manufacturing steps to be increased. To this end, the optical module shown in FIG. 2 is arranged so that the propagation light satisfies the total reflection condition at the interface 61, that is, meets a relationship, $\varphi 1 - \sin^{-1}[(n1/n2)\sin \varphi 1] - \sin^{-1}(n1/n2) \geqq 0$, wherein φ1 denotes the tilted surface angle of the second tilted surface 15, n2 denotes the refractive index of the second optical function integrate substrate 16, and n1 denotes the refractive index of a substance surrounding the second optical function integrate substrate. In this case, the need for the reflecting film 23 can be eliminated.

Embodiment 3

FIGS. 3A to 3F and FIGS. 4A to 4D are diagrams for explaining a method of manufacturing the optical module shown in FIG. 1 in accordance with a third embodiment of the present invention.

Figure 3A:
FIGS. 3A to 3F are diagrams for explaining how to manufacture an optical module in accordance with a third embodiment of the present invention.
Figure 3B:
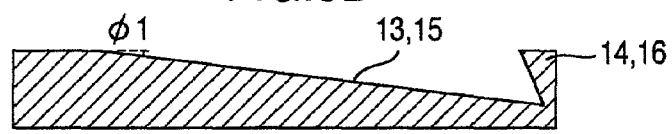
Figure 3C:
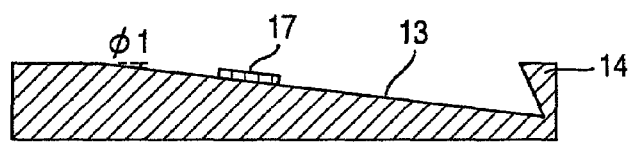
Figure 3D:
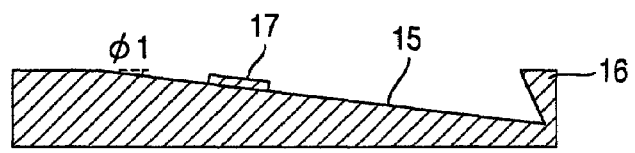
Figure 3E:
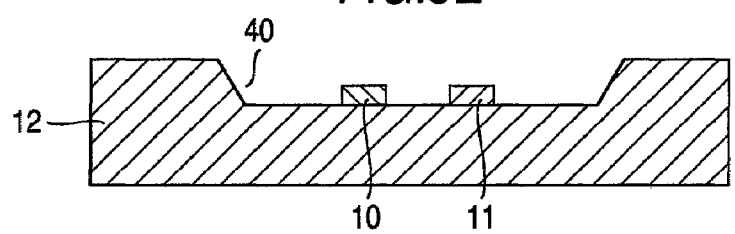
Figure 3F:
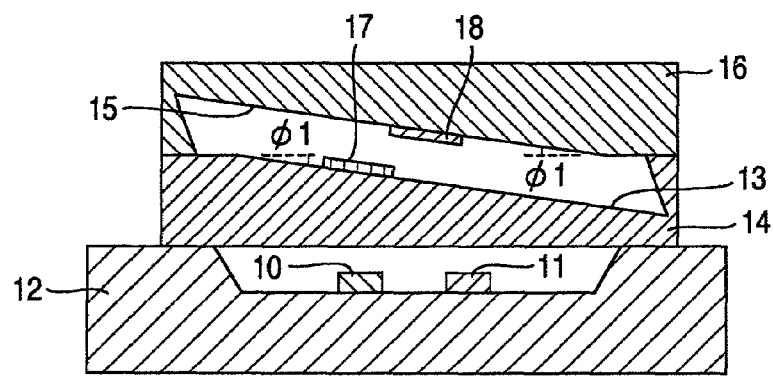

In the manufacturing procedure, a mask 35 such as an oxide film is first formed in the form of a pattern on a substrate made of Si or the like as a base for the aforementioned first and second optical function integrate substrates 14 and 16 as shown in FIG. 3A. Next, as shown in FIG. 3B, the surface of the substrate 14, 16 is etched to form surfaces 13, 15 tilted by an angle φ1. The etching can be carried out by using one selected from various techniques including cutting, dry etching and wet etching. With regard to a Si substrate, however, an arbitrary angle is determined by its crystalline orientation, so that it is desirable to employ wet etching capable of obtaining a relatively smooth etched surface using an aqueous solution of potassium hydroxide (KOH) rather than a physical processing method. When a Si (110) plane substrate is etched as it is, the tilt angle ϕ1 becomes about 54 degrees. However, when it is desired to set the tilt angle at another arbitrary value, an off substrate having a predetermined tilted angle with respect to a crystal plane is used, thus enabling angle control. After a optical wavelength filter 17 is next formed on the tilted surface 13 of the substrate 14 as shown in FIG. 3E, a first optical function integrate substrate 14 is completed. The optical wavelength filter 17 is formed in the form of a multi-layered dielectric film. In this case, since light emitted from the laser diode has a wavelength of 1.31 μm and light directed onto the photo detector has a wavelength of 1.55 μm, the filter has a function of passing the 1.31 μm-wavelength light therethrough and reflecting the 1.55 μm-wavelength light. Similarly, after a reflecting film 18 is formed on the tilted surface 15 of the substrate 16 as shown in FIG. 3D, a second optical function integrate substrate 16 is completed. In this case, the optical wavelength filter 18 has a function of reflecting the 1.55 μm-wavelength light. In FIG. 3E, a laser diode 10 and a photo detector 11 are mounted on the substrate 12 to obtain an optical element mount substrate 12. In this connection, upon mounting these optical elements, it is effective to previously make a recess 40 in the optical function integrate substrate 12 in such a manner as to avoid the mounted elements from being extruded from the top surface of the optical function integrate substrate, considering later mounting operation of the optical function integrate substrate. As shown in FIG. 3F, finally, after the first optical function integrate substrate 14 is mounted on the optical element mount substrate 12 so that the first tilted surface 13 is upside, and the second optical function integrate substrate 16 is further mounted on the first optical function integrate substrate 14 so that the tilted surface 15 is downside. At this stage, an optical module in accordance with the present invention is completed.

Figure 4A:
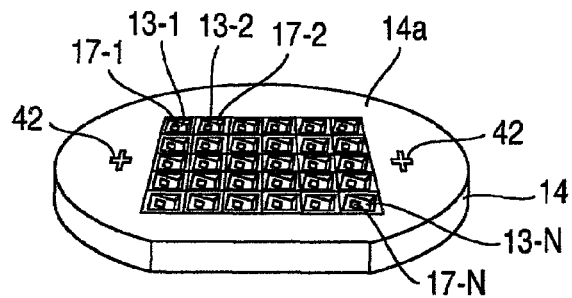
FIGS. 4A to 4D are diagrams for explaining, in a wafer scale, how to manufacture the optical module of the third embodiment of the invention.
Figure 4B:
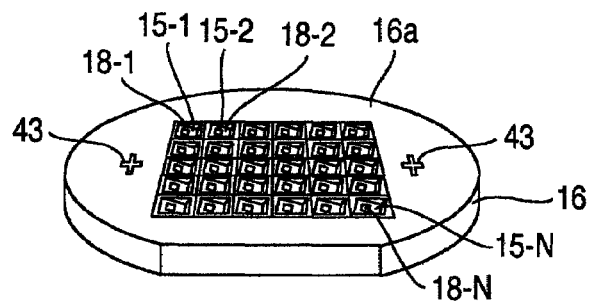
Figure 4C:
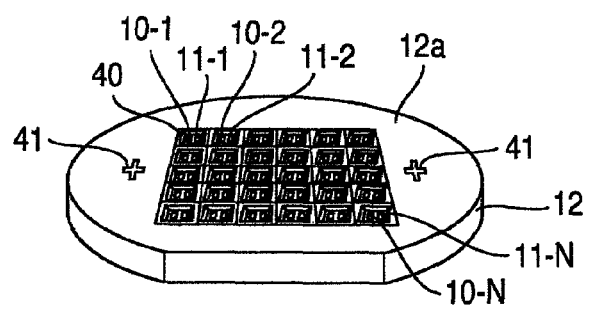
Figure 4D:
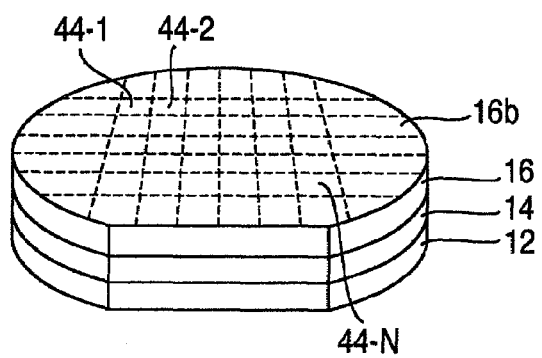

FIGS. 4A to 4F shows, in a wafer scale, the aforementioned manufacturing procedure. As in the explanation of FIG. 3, when a mask pattern is formed in the plane of the substrate 14 and then the substrate is etched, a plurality of tilted surfaces 13-1, 13-2, . . . and 13-N are simultaneously formed in FIG. 4A. When a plurality of optical wavelength filters 17-1, 17-2, . . . , and 17-N are simultaneously formed on the respective tilted surfaces by a deposition or sputtering process, the first optical function integrate substrate 14 can be manufactured at wafer level. At this time, alignment marks 42 are previously formed on the outer part of the surface of the substrate 14 by directly marking a metal or dielectric film or the substrate. In FIG. 4B, a plurality of tilted surfaces 15-1, 15-2, . . . , and 15-N, a plurality of reflecting films 18-1, 18-2, . . . , and 18-N, and alignment marks 43 are previously formed in the surface of the substrate 16 by a technique similar to the aforementioned technique. As a result, a second optical function integrate substrate 16 is manufactured. As shown in FIG. 4C, a plurality of recesses 40-1 to 40-N and alignment marks 41 are formed in the surface of the substrate 12 by wet etching or the like, and laser diodes 10-1 to 10-N and the photo detectors 11-1 to 11-N are mounted on the respective recesses of the substrate. As a result, the optical element mount substrate 12 can be manufactured at wafer level. As shown in FIG. 4D, finally, the first and second optical function integrate substrates 14 and 16 are laminated on the optical element mount substrate 12, aligned with one another based on the alignment marks 41, 42 and 43 and then bonded to one another. The bonding process is not specifically limited and may be carried out by a method of using solder in ordinary electrical mounting, by a solderless wafer joining technique or by another suitable technique. Thereafter, the bonded substrates are cut into chips by dicing or the like. In this way, since a plurality of modules 44-1 to 44-N are manufactured from a single wafer, this method is suitable for mass production.

Embodiment 4

Figure 5:
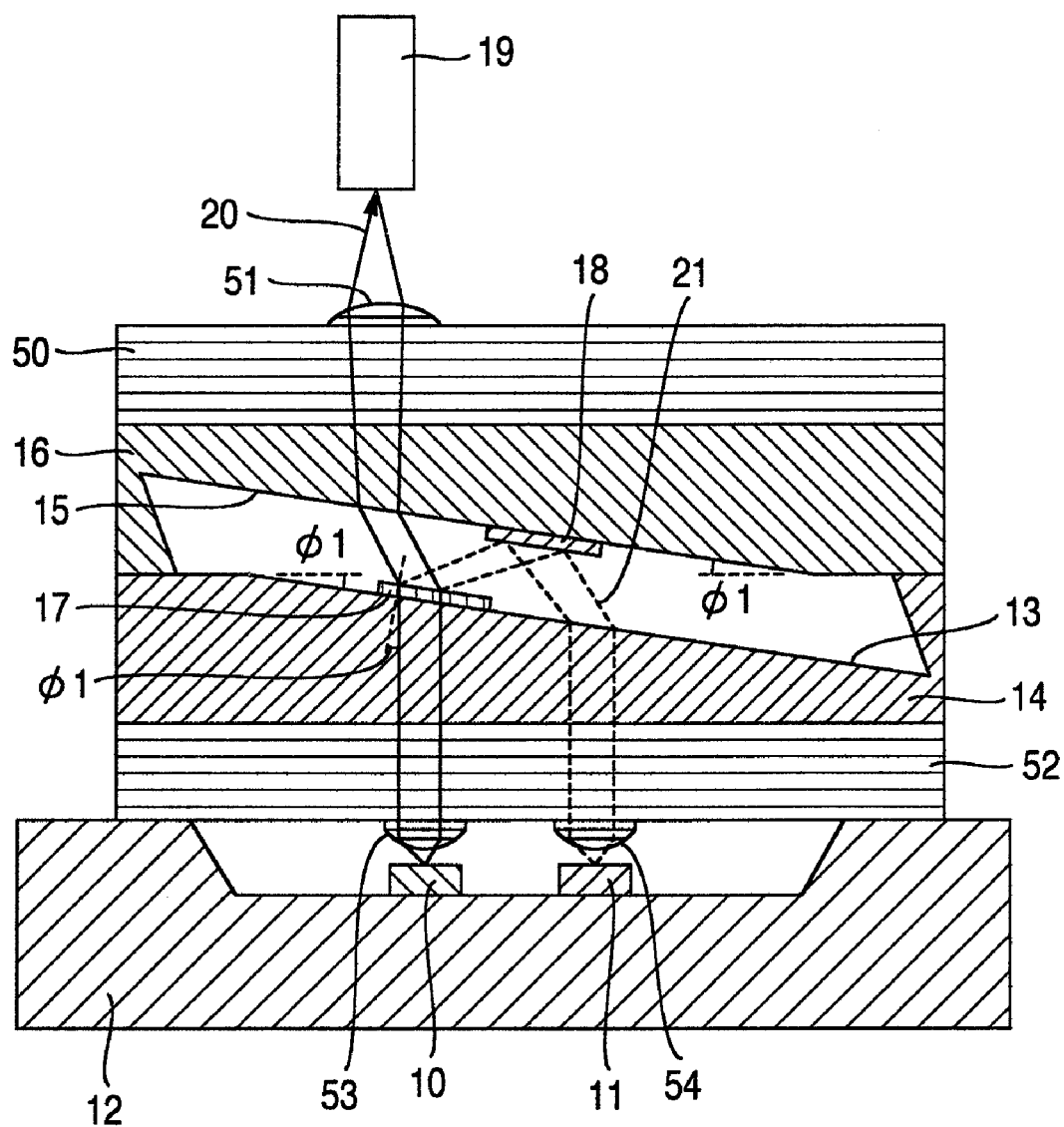
FIG. 5 is a cross-sectional view of an optical module in accordance with a fourth embodiment of the present invention, showing an example when a lens is provided in the optical module of the first embodiment.
Figure 6:
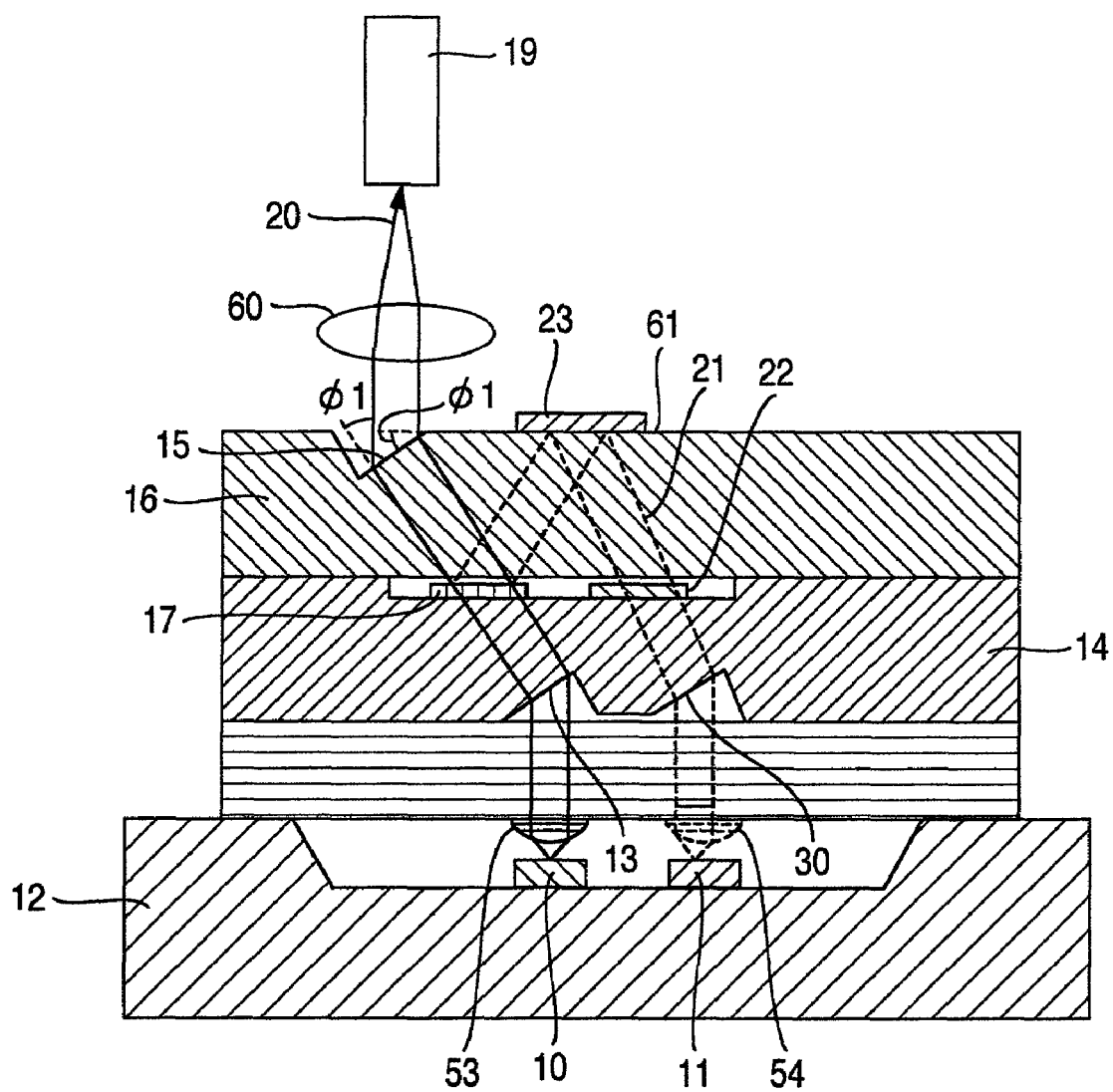
FIG. 6 is a cross-sectional view of the optical module of the fourth embodiment of the invention, showing an example when a lens is provided in the optical module of the second embodiment.

FIGS. 5 and 6 show cross-sectional views of an optical module in accordance with a fourth embodiment of the present invention. FIG. 5 shows an example when lenses are additionally provided in an optical path connected between the optical element and the first tilted surface and in an optical path connected between the optical fiber and the second tilted surface in the structure of the optical module of the first embodiment.

As shown in FIG. 5, in an actual optical module, light 20, 21 transmitted between a laser diode 10, a photo detector 11 and an optical fiber 19 is propagated in an arbitrary beam system with a spread angle. For the purpose of obtaining a high optical coupling efficiency between the optical fiber 19 and the respective optical elements, and stable filter characteristics of the optical wavelength filter 17 and reflecting film 18, it is effective to provide lenses for condensing or collimating propagation light in the optical module. To this end, in the example of FIG. 5, a substrate 52 has lenses 53, 54 provided in optical paths between the laser diode 10 mounted on the optical element mount substrate 12 and the first tilted surface 13 and between the photo detector 11 mounted on the substrate 12 and the first tilted surface 13; and a substrate 50 has a lens 51 provided in an optical path connected between the optical fiber 19 and the second tilted surface 15 of the second optical function integrate substrate 16.

With this arrangement, the light 20 emitted from the laser diode 10 mounted on the optical element mount substrate 12 is converted by the substrate 50 into a collimate beam, passed through the lens substrate 52, the first optical function integrate substrate 14, the first optical function integrate substrate 14, the first optical wavelength filter 17, the second optical function integrate substrate 16, and the lens substrate 50, and again condensed by the lens 51 to be optically connected with the optical fiber 19 provided outside of the substrate. The light 21 output from the optical fiber 19 is converted by the lens 51 into a collimated beam, passed through the lens substrate 50 and the second optical function integrate substrate 16, reflected by the first optical wavelength filter 17 and the reflecting film 18, passed through the first optical function integrate substrate 14 and the lens substrate 52, condensed by the lens 54, and then directed onto the photo detector 11 provided on the optical element mount substrate 12. As a result, the optical module can obtain a high optical coupling efficiency between the optical fiber 19 and the respective optical element and also stable filter characteristics for the optical wavelength filter 17 and the reflecting film 18.

Similarly, FIG. 6 shows an example when lenses are additionally provided in an optical path connected between an optical element and first and third tilted surfaces and in an optical path connected between the optical fiber and a second tilted surface in the structure of the optical module of the second embodiment. Even this arrangement can obtain a high optical coupling efficiency between the optical fiber 19 and the respective optical elements and stable filter characteristics for the optical wavelength filters 17, 22. The lens provided between an optical path connected between the optical fiber 19 and the second tilted surface 15 provided in the second optical function integrate substrate 16 may be spaced from the optical module, for example, as a lens 60 shown in FIG. 6. Even when the lens is provided, e.g., in the package side, the optical module has the same operation as the aforementioned module.

Embodiment 5

Figure 7:
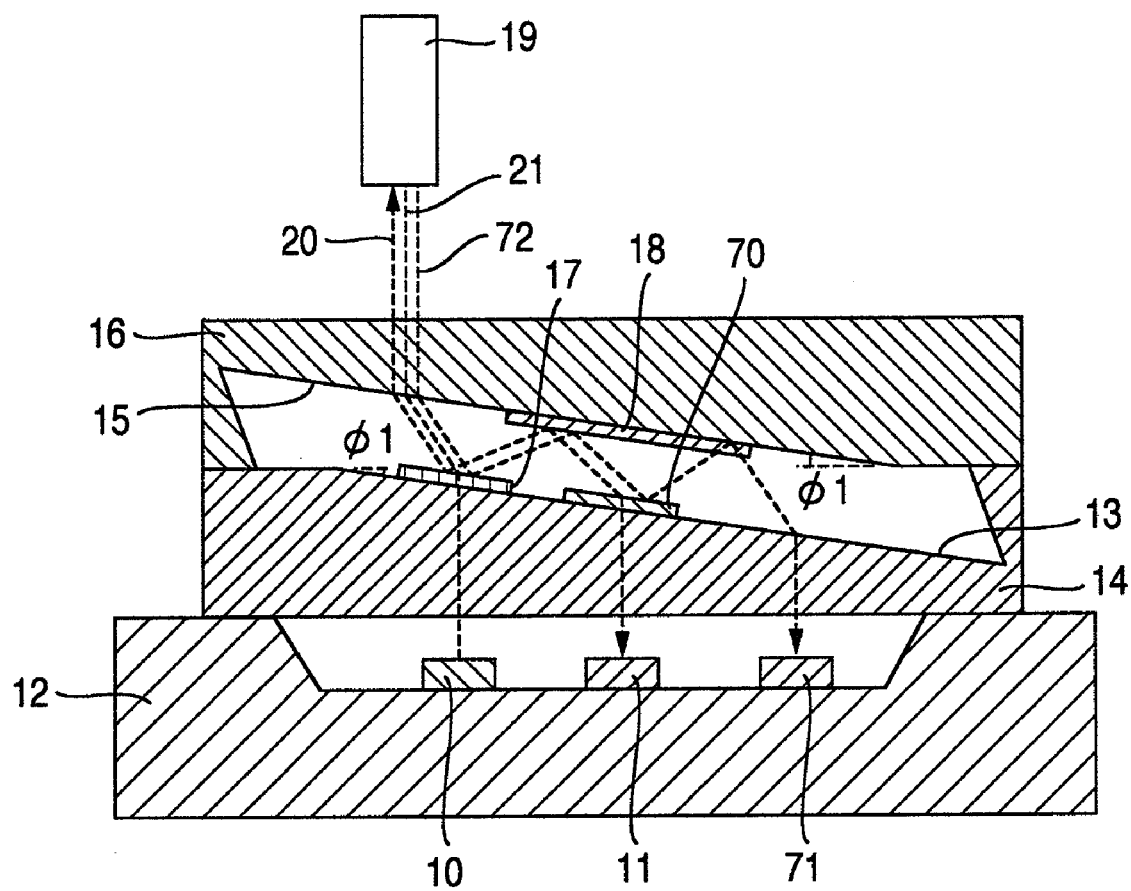
FIG. 7 is a cross-sectional view of an optical module in accordance with a fifth embodiment of the present invention, showing an example when light transmitted in the optical module of the first embodiment is added in the optical module.
Figure 8:
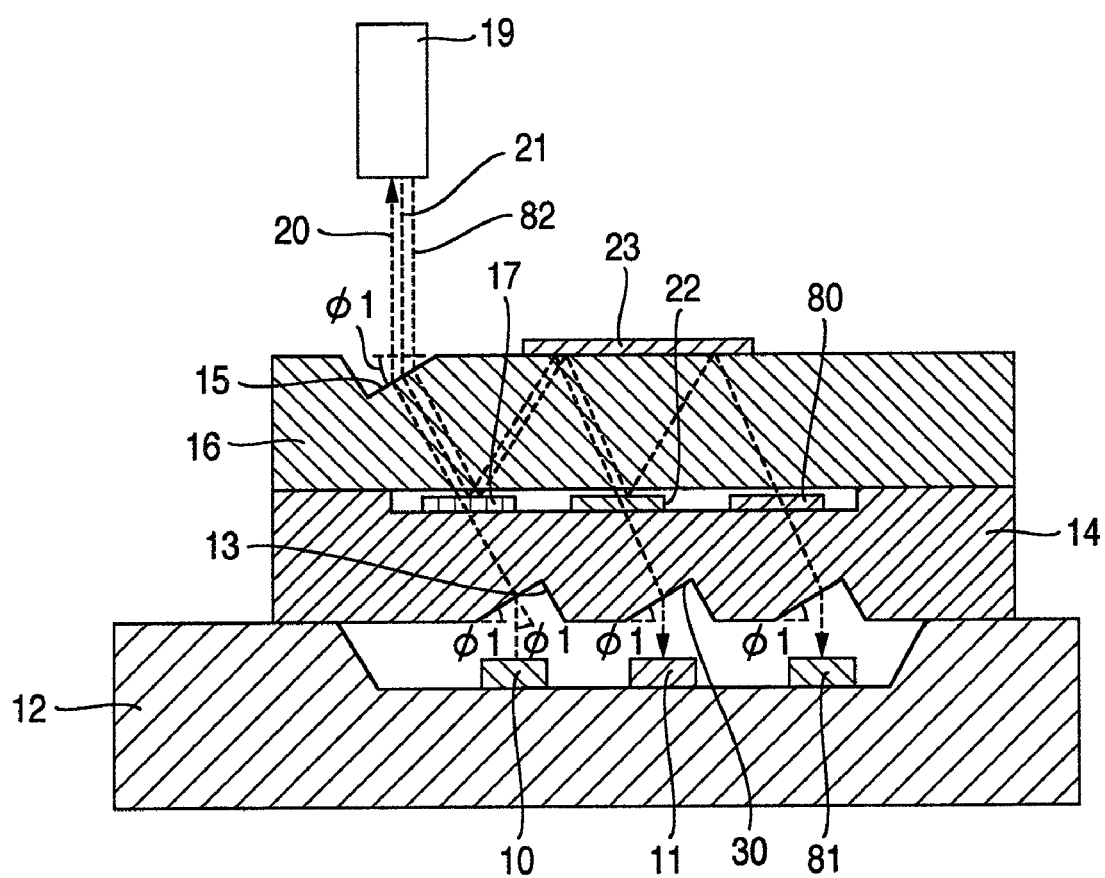
FIG. 8 is a cross-sectional view of the optical module of the fifth embodiment of the invention, showing an example when light transmitted through the optical module of the second embodiment is added in the optical module.

FIGS. 7 and 8 show cross-sectional views of an optical module in accordance with a fifth embodiment of the present invention. FIG. 7 shows an example when light to be transmitted in the optical module is added in the optical module structure of the first embodiment. In other words, the number of WDM (wavelength division multiplexing) channels is 2 in the embodiment of FIG. 1, but 3 in the present embodiment.

As shown in FIG. 7, when light 72 output from the optical fiber 19 is added, this correspondingly requires only addition of a third optical wavelength filter 70 on the first optical function integrate substrate 14 and of a photo detector 71 on the optical element mount substrate 12.

In this case, the light 72 output from the optical fiber 19 is passed through the second optical function integrate substrate 16; multiplexed and reflected by the first optical wavelength filter 17, the reflecting film 18, the third optical wavelength filter 70, and the reflecting film 18; passed through the first optical function integrate substrate 14; and then directed onto the photo detector 71 mounted on the optical element mount substrate 12. Even when it is desired to expand the function of this structure, an optical module compatible with single-fiber/3-wavelength transmission can be manufactured with use of a minimum number of necessary components and a minimum number of manufacturing steps. Similarly, FIG. 8 shows an example when light to be transmitted in the optical module is added in the optical module structure of the second embodiment. Even in this example when light 82 output from the fiber 19 is added, the optical module can be manufactured by correspondingly adding a third optical wavelength filter 80 on the first optical function integrate substrate 14 and adding a photo detector 81 on the optical element mount substrate 12.

Embodiment 6

Figure 9:
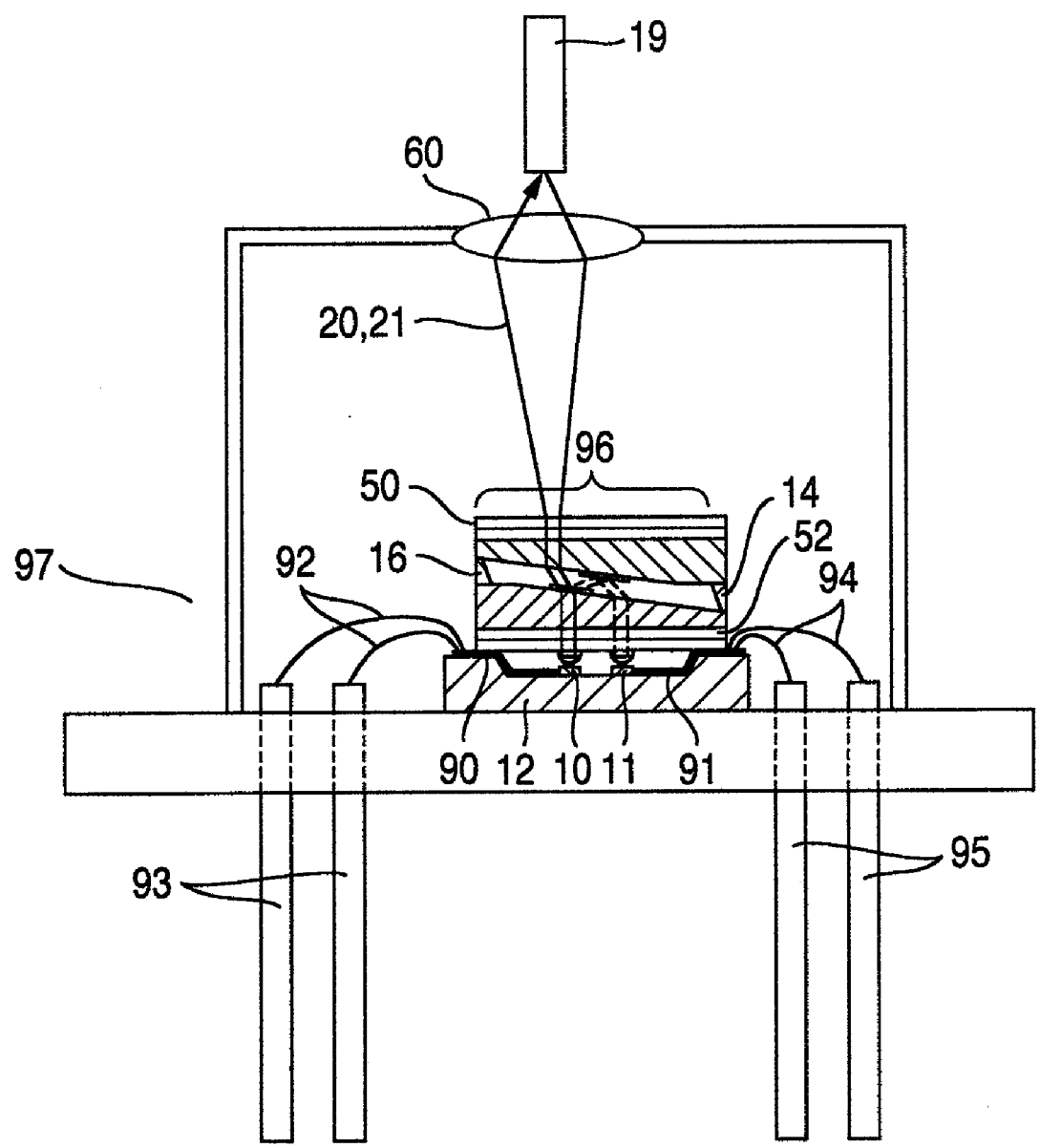
FIG. 9 is a cross-sectional view of an optical module in accordance with a sixth embodiment of the present invention.

FIG. 9 is a cross-sectional view of an optical module in accordance with a sixth embodiment of the present invention, showing an example when the optical module of the first embodiment is packaged.

With this structure, an optical module 96, which includes the optical element mount substrate 12, the lens substrate 52, the first and second optical function integrate substrates 14, 16, and the lens substrate 50 laminated in the substrate thickness direction, are mounted in a package 97.

Electric lines 90, 91 are provided on the optical element mount substrate 12 by metal deposition or the like, and the laser diode 10 and the photo detector 11 are mounted so as to be electrically by the electric lines. Since the electric lines 90, 91 are connected by electric terminals 93, 95 and metal wires 92, 94; transfer of power and electric signals between the optical module 96 and a device outside of the package 97 can be achieved.

The lens 60 is located at an arbitrary position in the upper surface of the package so that the lights 20, 21 propagated between the laser diode 10, the photo detector 11 and the optical fiber 19 provided outside of the package are optically connected by the optical module 96 and the lens 60.

In this way, since the optical module of the present invention can integrate all optical functions in a single package on the chip scale when compared with the prior art BIDI module having the aforementioned LD, PD and WDM filters as optical components spatially arranged, the optical module can be made compact with an excellent productivity. With this arrangement, since the optical module 96 is spatially and optically connected by the lens 60 with the optical fiber 19 provided outside of the package and the package can be hermetically sealed, the optical module can have a high reliability.

Embodiment 7

Figure 10:
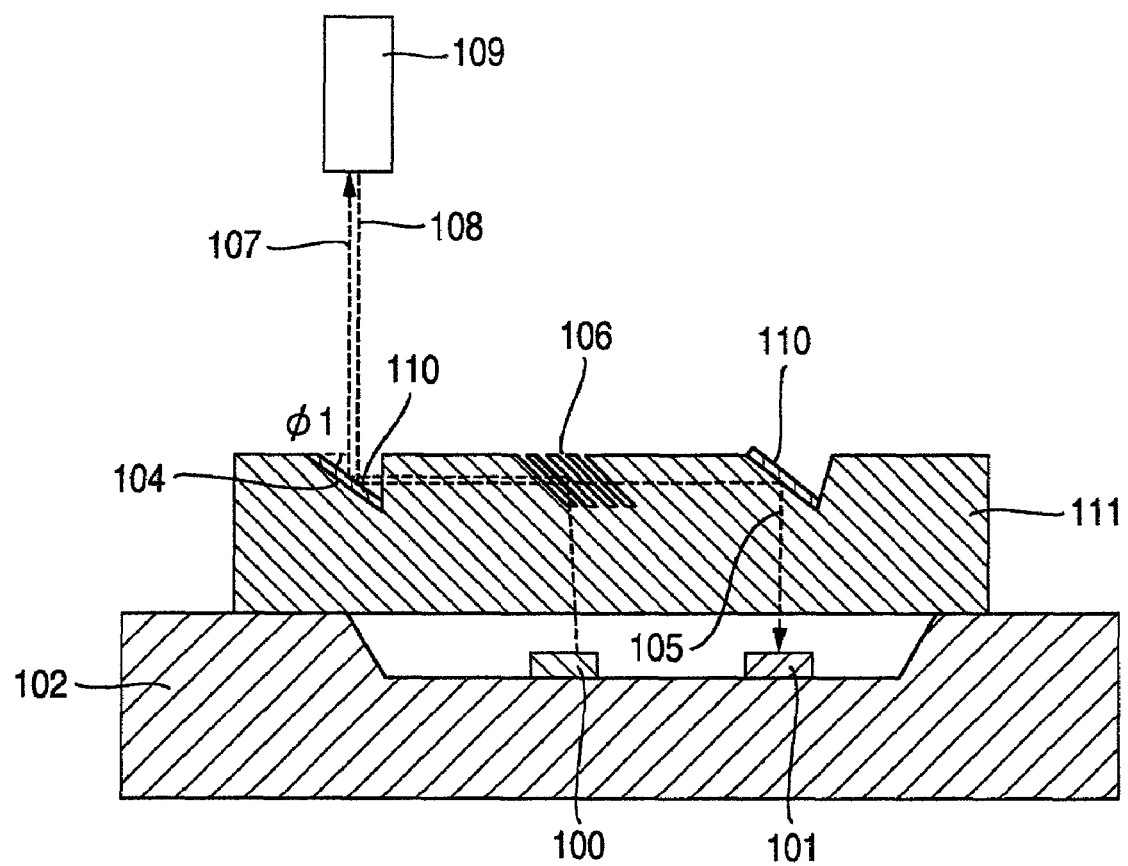
FIG. 10 is a cross-sectional view of an optical module in accordance with a seventh embodiment of the present invention.

FIG. 10 shows a cross-sectional view of an optical module in accordance with a seventh embodiment of the present invention.

The arrangement of FIG. 10 includes an optical element mount substrate 102 and an optical function integrate substrate 111. The optical element mount substrate 102 has a laser diode 100 and a photo detector 101 mounted thereon on a straight line in a horizontal direction of the substrate surface. The optical function integrate substrate 111 has a first tilted surface 104 which is formed in one surface of the substrate 111, which has a face tilted at an angle to one surface of the substrate, and which changes the optical path of propagation light along the substrate thickness direction or in the horizontal direction by an angle of 90 degrees. The optical function integrate substrate 111 also has a second tilted surface 105 which is formed in the same plane as the first tilted surface 104, which has a face tilted at an angle to the parallel surface of the substrate, and which changes the optical path of propagation light in the substrate thickness direction or the horizontal direction by an angle of 90 degrees. The optical function integrate substrate 111 also has an optical wavelength filter 106 formed at a predetermined angle to the plane direction of the substrate in an optical path between the first and second tilted surfaces 104 and 105.

With this arrangement, the optical element mount substrate 102 and the optical function integrate substrate 111 are laminated in the substrate thickness direction. Light 107 emitted from the laser diode 100 mounted on the optical element mount substrate 102 toward above the upper side of the substrate is changed in optical path by the optical wavelength filter 106 provided in the optical function integrate substrate 111 to the substrate horizontal direction, propagated in the interior of the optical function integrate substrate, changed in optical path by the first tilted surface 104 to the substrate thickness direction, and optically connected with the light 107 provided outside of the substrate. Light 108 output from the optical fiber 109 toward the optical function integrate substrate 111 and having a wavelength different from that of the light 107 emitted from the laser diode 100 is also changed in optical path by the first tilted surface 104 provided in the optical function integrate substrate 111 to the substrate horizontal direction, passed through the optical wavelength filter 106, changed in optical path by the second tilted surface 105 to the substrate thickness direction, and then directed onto the photo detector 101 mounted on the optical element mount substrate. In this way, this arrangement can have a function of bidirectional transmission over a single optical fiber. A reflecting film 110 is provided on the second tilted surface 105.

With this structure, since the optical module can be manufactured using a single optical element mount substrate and a single optical function integrate substrate when compared with the optical module of the first embodiment, the optical module can be made more compact with a high integration.

Similarly to the optical modules explained in the first and third embodiments, since the optical element mount substrate 102 and the optical function integrate substrate 111 can be manufactured each by a wafer process, the present optical module can be expected to remarkably reduce the number of components and the number of manufacturing steps with a resultant low cost, over the prior art system when separate optical components are mounted respectively on the substrate.

In this case, it is necessary to provide the light reflecting film 110 on the first and second tilted surfaces 104 and 105 made in the optical function integrate substrate 111 to reflect propagation light by an angle of 90 degrees. The material of the reflecting film is not specifically limited. However, it is desirable from the viewpoint of consideration of the loss of the reflecting part that the reflecting film be a metal or multi-layered dielectric film having a reflectivity at least not lower than 70% with respect to the wavelength of the propagation light.

Similarly to the optical modules explained in the first and third embodiments, the material of the optical element mount substrate 102 is preferably semiconductor as Si or ceramic. The material of the optical function integrate substrate 111 is required to transparent to the wavelength of propagation light, and suitably silica glass, Si, InP, GaAs or the like.

When the optical wavelength filter 106 provided in the optical function integrate substrate 111 is made in the form of a diffraction grating obtained by processing the Si material into slanted deep slots, the optical function integrate substrate 111 having both the optical path change function and the filter function can be formed on the same substrate by a wafer process.

Embodiment 8

Figure 11:
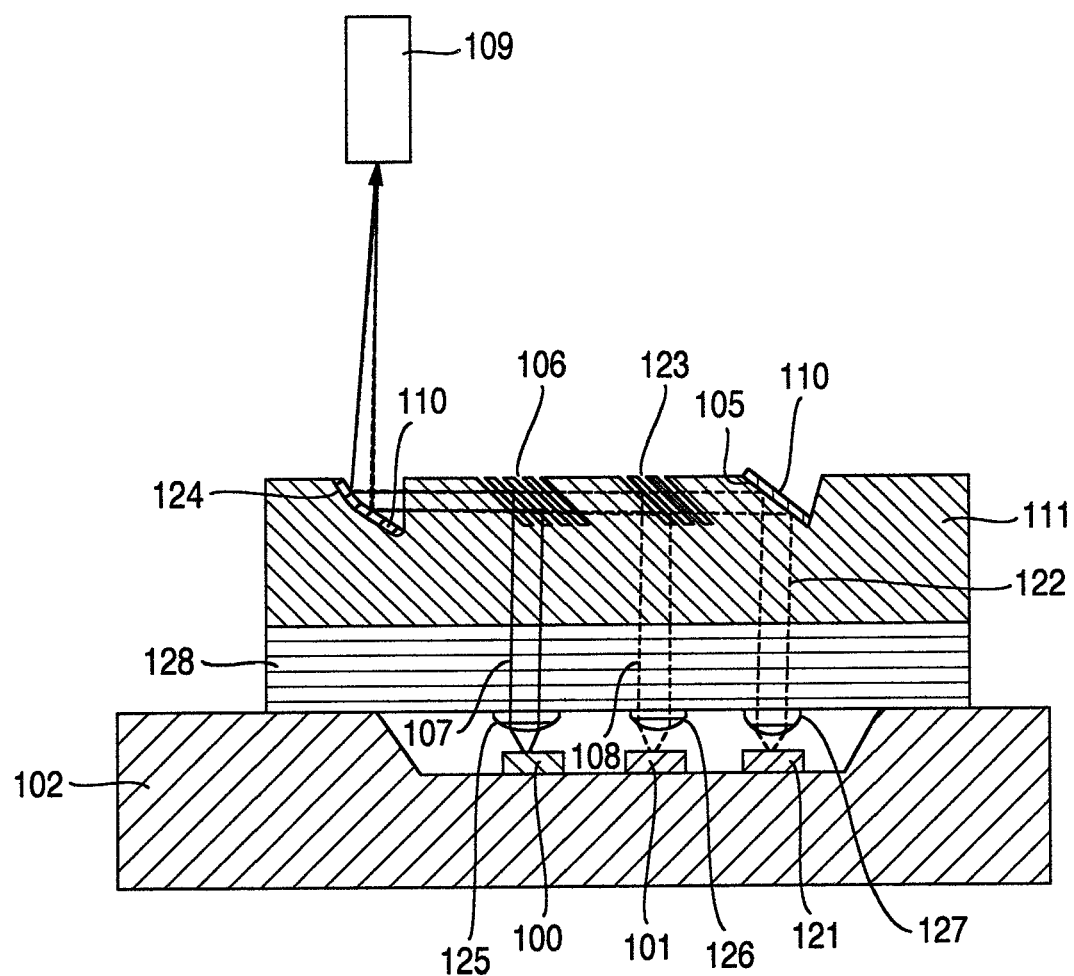
FIG. 11 is a cross-sectional view of an optical module in accordance with an eighth embodiment of the present invention.
Figure 12:
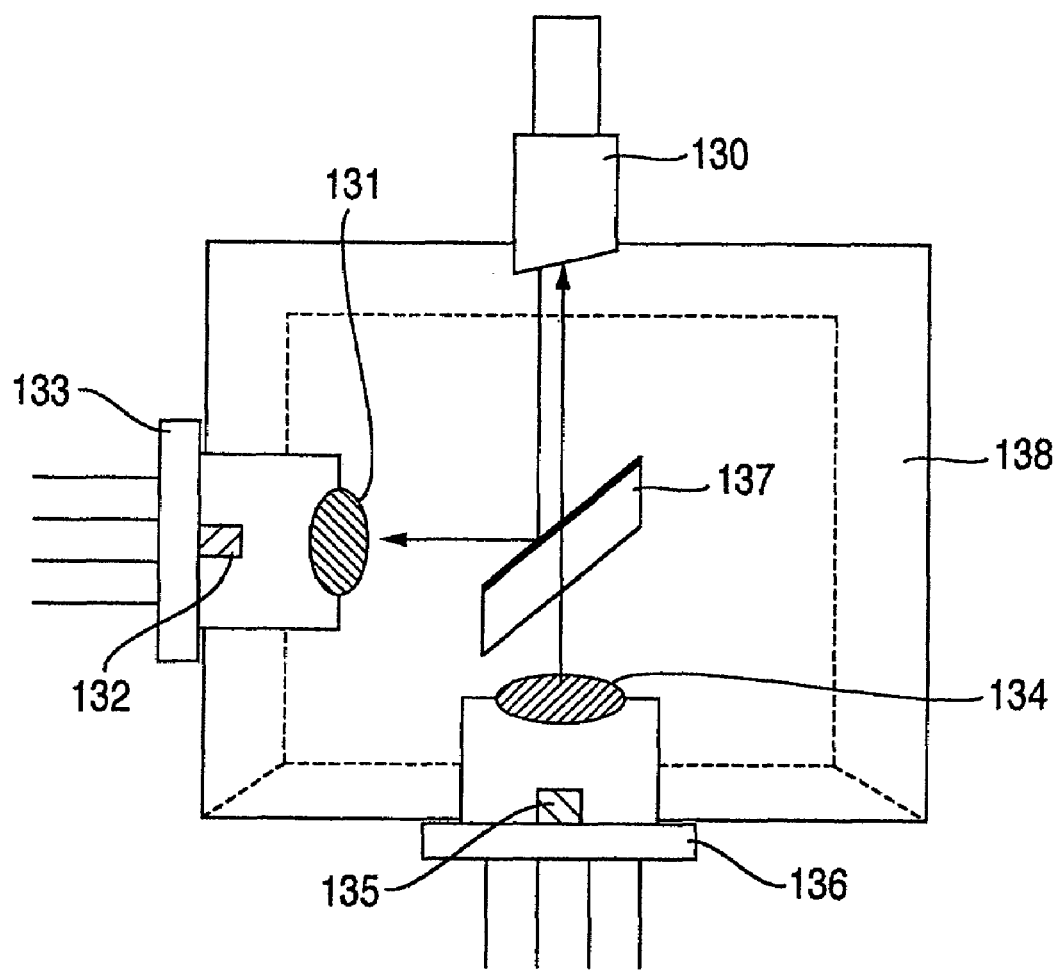
FIG. 12 shows a basic arrangement of a prior art BIDI module of a first system.
Figure 13:
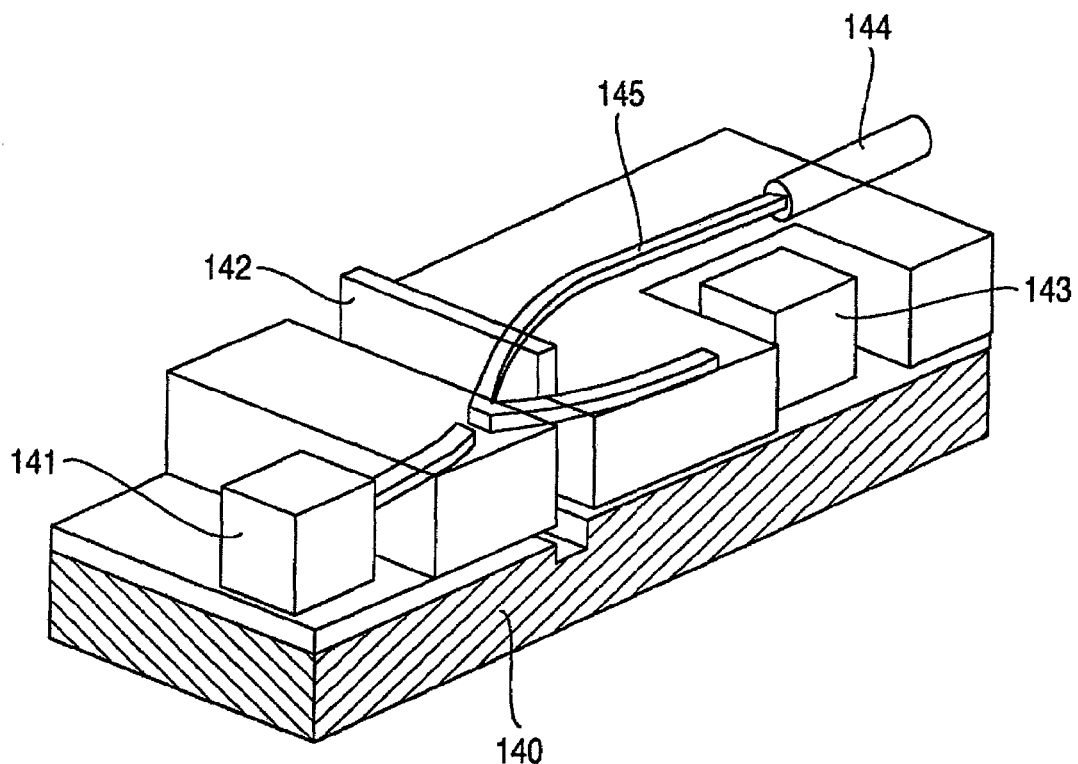
FIG. 13 shows a basic arrangement of a prior art PLC module of a second system.
Figure 14A:
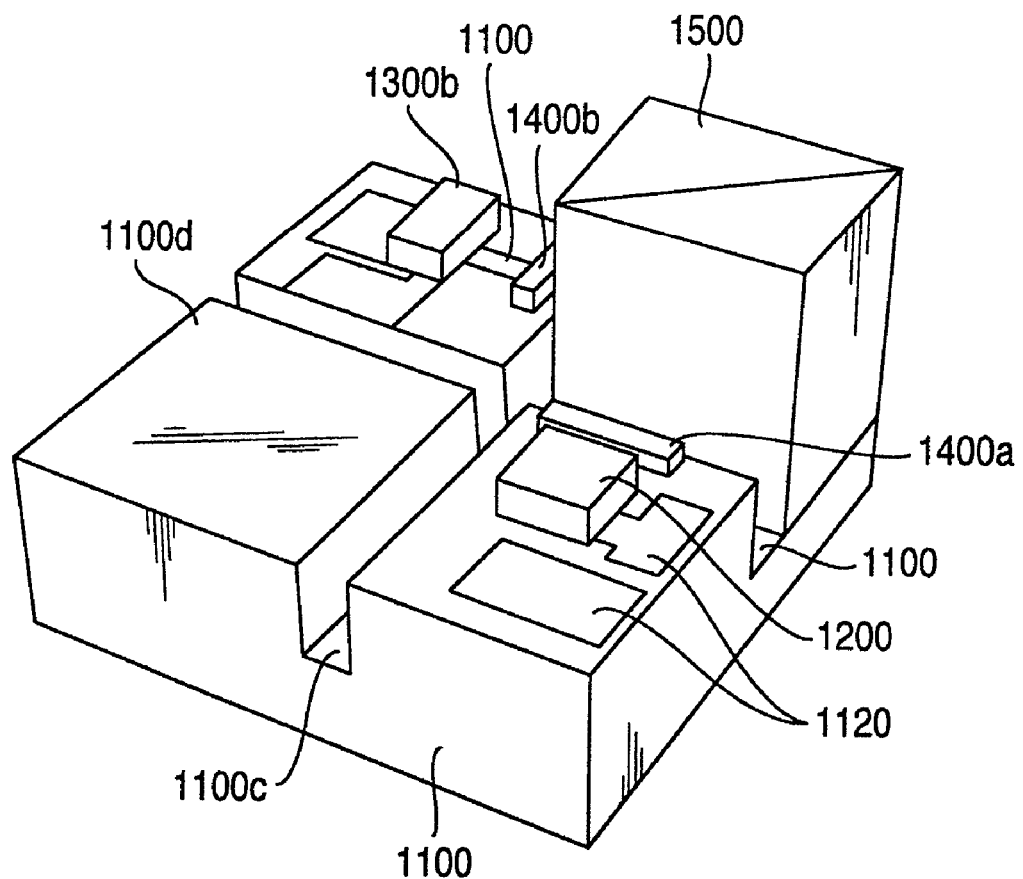
FIG. 14A is a perspective view of such a prior art mounting structure of an optical module as disclosed in JP-A-2006-154535.
Figure 14B:
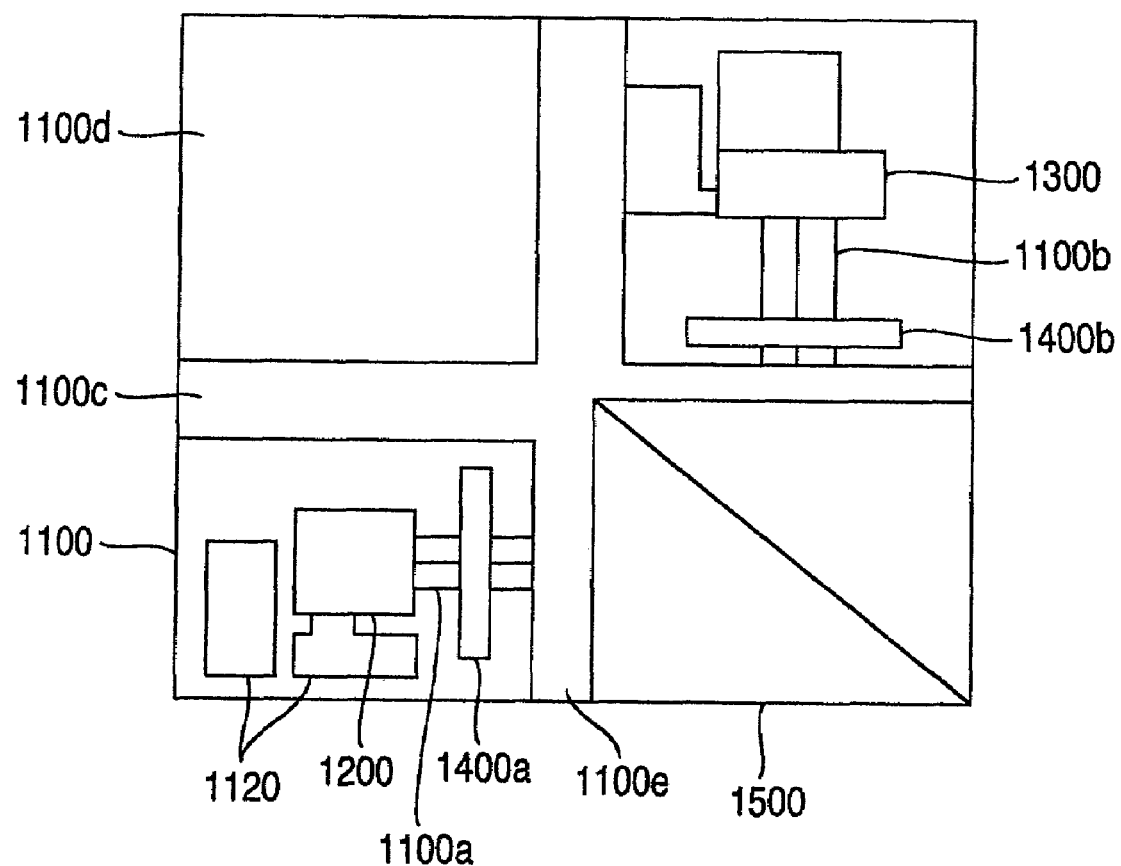
FIG. 14B is a top view of such a prior art mounting structure of the optical module as disclosed in JP-A-2006-154535.

FIG. 11 is a cross-sectional view of an optical module in accordance with an eighth embodiment of the present invention. FIG. 11 shows an example when light to be transmitted in the module is added in the optical module structure of the seventh embodiment, and further when lenses 125, 126, 127 are provided in optical paths between optical elements and optical wavelength filters 106, 123, the second tilted surface 105 and in an optical path between the optical fiber and the first tilted surface.

As shown in FIG. 11, when light 122 output from the optical fiber 19 is added, it is only required to add a second optical wavelength filter 123 on the optical function integrate substrate 111 and also a photo detector 121 on the optical element mount substrate 102.

In the example of FIG. 11, a substrate 128 is mounted on the optical element mount substrate 102. The substrate 128 has the lenses 125, 126, 127 mounted thereon in the respective optical paths connected between the laser diode 100 mounted on the optical element mount substrate 102 and the optical wavelength filter 106, between the photo detector 101 and the second optical wavelength filter 123, and between the photo detector 121 and the second tilted surface 105. A first tilted surface 124 provided in the optical function integrate substrate 111 is shaped to have a recessed curve.

With this structure, the light 107 emitted from the laser diode 100 mounted on the optical element mount substrate 102 toward above the substrate is converted by the lens 125 to a collimated beam, passed through the substrate 128 and the optical function integrate substrate 111, changed in its optical path by the optical wavelength filter 106 to a substrate horizontal direction, propagated in the interior of the optical function integrate substrate, changed in optical path by the first tilted surface 124 to a substrate thickness direction, condensed thereby, and optically connected with the light 107 provided outside of the substrate.

The light 108 output from the optical fiber 109 toward the optical function integrate substrate 111 and having a wavelength different from that of the light 107 emitted from the laser diode 100 is changed in optical path by the first tilted surface 124 to the substrate horizontal direction and also converted thereby to a collimated beam, passed through the optical wavelength filter 106, changed in optical path by the second optical wavelength filter to the substrate thickness direction, passed through the optical function integrate substrate 111, the substrate 128 and the reflecting film 110, condensed by the lens 126, and then directed onto the photo detector 101 mounted on the optical element mount substrate. Light 127 output from the optical fiber 109 toward the optical function integrate substrate 111 and having a wavelength another different wavelength is also propagated along an optical path similar to the light 126 and directed onto the photo detector 121.

As a result, similarly to the optical module of the fourth embodiment, this optical module can obtain a high optical coupling efficiency between the optical fiber 19 and the optical elements and also stable filter characteristics for the optical wavelength filters 106, 123.

Similarly to the sixth embodiment, even when this optical module is packaged, the module can be manufactured compact with its all optical functions integrated in the package on the chip scale, with an excellent productivity.

Technical subject matters associated with the foregoing embodiments are as follows.

1. Basic Structure of Two or Three Substrates

An optical module includes an optical element mount substrate having at least one laser diode and one photo detector mounted thereon on a straight line in a direction horizontal to the surface of the substrate; a first optical function integrate substrate made of a material transparent to the wavelength of propagation light, the first optical function integrate substrate being provided in one surface thereof with at least one first surface tilted at an angle to the parallel surfaces of the substrate for refracting light propagated in a substrate thickness direction; and a second optical function integrate substrate made of a material transparent to the wavelength of light different from that of the first substrate, the second substrate being provided in its one surface with at least one second surface tilted at an angle to the parallel surfaces of the substrate for refracting light propagated in a substrate thickness direction. At least two first and second optical wavelength filters having different wavelength transmissivities to propagation light are provided in optical paths between the first and second tilted surfaces. The optical element mount substrate and the first and second optical function integrate substrates are laminated in respective substrate thickness directions so that light emitted from the laser diode mounted on the optical element mount substrate is passed through the first optical function integrate substrate, the first optical wavelength filter, and the second optical function integrate substrate, and optically connected with a single optical fiber provided outside of the substrate, and also so that light output from the optical fiber and having a wavelength different from that of the light emitted from the laser diode is passed through the second optical function integrate substrate, reflected by the first and second optical wavelength filters, passed through the second optical wavelength filter, and directed onto the photo detector mounted on the optical element mount substrate through the second optical function integrate substrate.

2. Parallel Tilted Surfaces (1) and (2)

In the optical module set forth in the above item 1, the first tilted surface provided on the first optical function integrate substrate is parallel to the second tilted surface provided on the second optical function integrate substrate.

3. How to Manufacture One-Piece Module

A method of manufacturing the optical module set forth in the above item 1 includes steps of forming the first tilted surface provided on the first optical function integrate substrate and the second tilted surface provided on the second optical function integrate substrate on a wafer by etching, collectively bonding the optical element mount substrate and the first and second optical function integrate substrates in the substrate thickness direction at wafer level, and cutting the bonded substrates into individual optical module chips.

4. Lens Addition

In the optical module set forth in the above item 2, a lens is provided at least one of optical paths connected between the optical element mounted on the optical element mount substrate and the first tilted surface provided on the first optical function integrate substrate and between the optical fiber and the second tilted surface provided on the second optical function integrate substrate.

5. Optical Element Details

In the optical module set forth in the above item 2, the optical elements mounted on the optical element mount substrate are a surface emitting laser diode and a surface illuminated photo diode having different wavelengths for emission and reception light respectively.

6. Relationship between Groove Angle and Refractive Index

In the optical module set forth in the above item 2, the angle $\phi 1$ of the second tilted surface provided on the second optical function integrate substrate, the refractive index $n2$ of the second optical function integrate substrate, and the refractive index $n1$ of a substance surrounding the second optical function integrate substrate satisfy a total reflection condition, $\phi 1 - \sin^{-1} [(n1/n2) \sin \phi 1] - \sin^{-1}(n1/n2) \geqq 0$.

7. Limited Substrate Material

In the optical module set forth in the above item 2, the material of the optical element mount substrate and the first and second optical function integrate substrates are made of silicon.

8. Limited Structure of Tilted Groove

In the optical module set forth in the above item 7, the first tilted surface provided on the first optical function integrate substrate and the second tilted surface provided on the second optical function integrate substrate are formed to have angles of the crystalline orientations of the substrates respectively.

9. Package Structure

In the optical module set forth in the above item 4, the optical element mount substrate and the first and second optical function integrate substrates are mounted in a package, the optical elements mounted on the optical element mount substrate and electric terminals provided on the package are electrically connected by electric lines formed on the optical element mount substrate, and the optical fiber optically connected with the optical elements by the first and second optical function integrate substrate and the optical wavelength filter is provided on the upper surface of the package.

10. Basic Structure of One-Piece Substrate

An optical module includes an optical element mount substrate having at least one laser diode and one photo detector mounted thereon on a straight line in a direction parallel to the surface of the substrate; and an optical function integrate substrate made of a material transparent to the wavelength of propagation light. The optical function integrate substrate is provided in its one surface with a first tilted surface which has a surface tilted at an angle to the parallel surfaces of the substrate and changes the optical path of propagation light in a substrate thickness direction or in a substrate horizontal direction by the angle of 90 degrees, and also provided in the same surface as the first tilted surface with a second tilted surface which has a surface tilted at an angle to the parallel surfaces of the substrate and changes the optical path of propagation light in the substrate thickness direction or in the substrate horizontal direction by the angle of 90 degrees. At least one optical wavelength filter tilted at an angle to the parallel surfaces of the substrate is provided in an optical path between the first and second tilted surfaces. The optical element mount substrate and the optical function integrate substrate are laminated in the substrate thickness direction so that light emitted from the laser diode mounted on the optical element mount substrate toward above the substrate is changed in optical path by the optical wavelength filter provided in the optical function integrate substrate to the substrate horizontal direction, propagated in the interior of the optical function integrate substrate, changed in optical path by the first tilted surface to the substrate thickness direction, and optically connected to a single optical fiber provided outside of the substrate; and also so that light output from the optical fiber toward the optical function integrate substrate and having a wavelength different from the light emitted from the laser diode is changed in optical path by the first tilted surface provided in the optical function integrate substrate to the substrate horizontal direction, passed through the optical wavelength filter, changed in optical path by the second tilted surface to the substrate thickness direction, and directed onto the photo detector mounted on the optical element mount substrate.

11. How to Manufacture One-Piece Module

A method of manufacturing the optical module set forth in the above item 10, includes steps of forming the first and second tilted surfaces provided in the optical function integrate substrate by etching on a wafer, collectively bonding the optical element mount substrate and the optical function integrate substrate in the substrate thickness direction at wafer level, and cutting the bonded substrates into individual optical module chips.

12. Reflecting Film Provided on the Tilted Surface

In the optical module set forth in the above item 10, a light reflecting film having a reflectivity not smaller than 70% to the wavelength of propagation light is formed on the first and second tilted surfaces provided in the optical function integrate substrate.

13. Limited Substrate Material

In the optical module set forth in the above item 12, the optical element mount substrate and the optical function integrate substrate are both made of silicon.

14. Limitation to the Structure of the Tilted Groove

In the optical module set forth in the above item 13, the first and second tilted surfaces provided in the optical function integrate substrate are formed to have angles of crystal orientations of the substrates.

15. Filter Details

In the optical module set forth in the above item 13, the optical wavelength filter provided in the optical function integrate substrate is formed by processing the Si material into deep slots.

16. Lens Addition

In the optical module set forth in the above item 12, a lens is provided in at least one of optical paths connected between the optical elements mounted on the optical element mount substrate and the optical wavelength filter and the second tilted surface provided in the optical function integrate substrate and between the optical fiber and the first tilted surface.

17. Lens Shape for the Tilted Surface (3)

In the optical module set forth in the above item 16, the first tilted surface is formed to have a recessed curve surface.

18. Package Structure

In the optical module set forth in the above item 16, the optical element mount substrate and the optical function integrate substrate are mounted in a package, the optical elements mounted on the optical element mount substrate and electric terminals provided to the package are electrically connected by electric lines formed on the optical element mount substrate, and the optical fiber optically connected with the optical elements by the first and second tilted surfaces and the optical wavelength filter provided in the optical function integrate substrate is provided in the upper surface of the package.

In accordance with the present invention, there can be provided an optical module as a terminal device of wavelength division multiplexing optical transmission or bidirectional transmission via a single optical fiber, which can transmit light having a plurality of wavelengths via the single optical fiber, remarkably reduce the number of optical components and the number of mounting steps by a batch manufacturing process such as a wafer process, be manufactured compact with a high yield while securing good optical characteristics with a low loss and a high reliability; and also a method of manufacturing the optical module.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An optical module comprising:
a member having first and second planar surfaces opposed to each other,
wherein said member has a cavity therein and the cavity has opposing third and fourth planar surfaces therein and said third planar surface is parallel to the fourth planar surface;
wherein an extended line of a first line belonging to the first planar surface is intersected by an extended line of a third line belonging to said third planar surface in one cross section of said member at a position of presence of said cavity and smaller one of intersection angles between said first and third lines is $\phi1$;
wherein an extended line of a second line belonging to said second planar surface is intersected by an extended line of a fourth line belonging to said fourth planar surface and smaller one of intersection angles between said second and fourth lines is $\phi1$;
wherein at least one reflecting film is provided on a part of said third planar surface; at least one optical wavelength filter is provided on a part of said fourth planar surface; said reflecting film and said optical wavelength filter are opposed at least partly to each other; said optical wavelength filter transparent to a wavelength $\lambda1$ and reflects light having a wavelength $\lambda2$; and $\lambda1$ and $\lambda2$ satisfy a relationship $\lambda1>\lambda2$ or $\lambda1<\lambda2$;
and a substrate provided with a laser diode and a photo detector;
wherein at least part of said substrate and at least part of said second surface of said member are fixed;
wherein first output light having the wavelength $\lambda1$ emitted from said laser diode is passed through the part of said member, said optical wavelength filter, said cavity and another part of said member, and directed into an optical fiber provided above said first surface of said member; and second output light output from said optical fiber and having the wavelength $\lambda2$ is passed through another part of said member and said cavity, reflected by said optical wavelength filter and said reflecting film, passed through said cavity and the part of said member, and directed onto said photo detector.

2. The optical module according to claim 1, wherein said member has first and second members or is made up of first and second members, and said first and second members are made of silicon.

3. The optical module according to claim 2, wherein said third surface of said first member is one of crystal planes of a silicon substrate, and said fourth surface of said second member is one of the crystal planes of the silicon substrate.

4. The optical module according to claim 1, wherein said first output light is directed from said first surface into said optical fiber directly or via a lens, and said second output light is directed from said optical fiber onto said first surface directly or via a lens.

5. The optical module according to claim 1, wherein said cavity has a vacuumed atmosphere, filled with air or a gas, or said cavity is filled with a material which allows wavelength division multiplexed light having the wavelengths $\lambda1$ and $\lambda2$ to be passed therethrough.

6. The optical module according to claim 1, wherein said laser diode is a surface emitting laser diode and said photo detector is a surface illuminated photo diode.

7. The optical module according to claim 6, wherein said substrate has a surface at a relatively high level and a surface at a relatively low level, said laser diode and said photo detector are provided on said surface at the low level, and said surface at the high level and said second surface of said member are fixed at least partly.

* * * * *